(12) United States Patent
Enomoto

(10) Patent No.: US 7,154,181 B2
(45) Date of Patent: Dec. 26, 2006

(54) SEMICONDUCTOR DEVICE AND METHOD OF MANUFACTURING THE SAME

(75) Inventor: Yoshiyuki Enomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 35 days.

(21) Appl. No.: 10/776,375

(22) Filed: Feb. 11, 2004

(65) Prior Publication Data

US 2004/0227241 A1 Nov. 18, 2004

(30) Foreign Application Priority Data

Feb. 21, 2003 (JP) .............................. 2003-043896

(51) Int. Cl.
*H01L 23/48* (2006.01)
*H01L 23/52* (2006.01)
*H01L 29/40* (2006.01)

(52) U.S. Cl. ..................... 257/774; 257/758; 257/781

(58) Field of Classification Search ................ 257/774, 257/781, 784, 622, 626, 758
See application file for complete search history.

(56) References Cited

U.S. PATENT DOCUMENTS 5,885,857 A * 3/1999 Yamaha et al. ............. 438/129
6,468,894 B1 * 10/2002 Yang et al. ................. 438/622

* cited by examiner

*Primary Examiner*—Nitin Parekh
(74) *Attorney, Agent, or Firm*—Sonnenschein Nath & Rosenthal LLP

(57) ABSTRACT

A semiconductor device and a method of manufacturing the device includes a first buried wiring, a second buried wiring formed as a layer different from the first buried wiring, a contact hole, which is formed between the first buried wiring and the second buried wiring and is filled with a wiring material for electrically connecting the first buried wiring and the second buried wiring therethrough, and a dummy hole, which has a hole diameter different from the contact hole, is so formed in vicinity of the contact hole as to connect the first buried wiring, and is filled with a wiring material therein.

6 Claims, 17 Drawing Sheets

SEMICONDUCTOR DEVICE AND METHOD OF MANUFACTURING THE SAME

RELATED APPLICATION DATA

The present application claims priority to Japanese Application(s) No(s). P2003-043896 filed Feb. 21, 2003, which application(s) is/are incorporated herein by reference to the extent permitted by law.

BACKGROUND OF THE INVENTION

This invention relates to a semiconductor device having a wiring pattern wherein two wiring are electrically connected with each other through a contact hole and also to a method for manufacturing the same.

Contact holes, which allow two wirings formed in different layers (upper and lower layers) to be electrically connected therethrough, are determined in number depending on the width of wirings layers to be connected therethrough and the current passing through the contact holes. It is the usual practice that plural contact holes are provided for one wiring when a relatively wide wiring layer called "wide wiring" is selected for the connection. In this connection, however, where two wirings having significantly large wiring widths are connected, e.g. when a wide wiring and a fine wiring having a smaller wiring width are connected with each other (for instance, in case of leading out from a power supply line by means of a fine wiring for fixing a potential), it is necessary to determine the number of contact holes in accord with the width of the fine wiring, so that the wide wiring may be unavoidably connected through a single contact hole.

On the other hand, in order to cope with the wiring delay caused by the scale down of wiring pitches, wiring materials for forming a wiring layer or insulating materials used for insulation between wiring layers have now given way to the use of low resistance wiring materials typical of which is Cu (copper) and low dielectric materials typical of which are SiLK, SiOC, and, the like. Cu for use as a low resistance wiring material has been reported as being more excellent in electromigration resistance than Al that has hitherto been in wide use as a wiring material. Nevertheless, where a fine wiring is formed by use of Cu, there has never been known an appropriate etching gas for permitting a Cu to be etched at a high selection ratio relative to an underlying insulating film in a dry etching procedure and thus, it is usual to form a buried wiring according to the Damascene technique. Especially, the dual Damascene technique wherein a contact hole or holes formed in an insulating film and a wiring groove, at which a buried wiring is formed, are simultaneously filled is promising from the standpoint of enlargement of an alignment margin by lithography and the reduction in number of steps. The forming method of a buried wiring using Cu is described, for example, in Japanese Patent Laid-open No. Hei 10-154709.

However, the use of Cu as a wiring material has the following disadvantages. As shown in FIGS. 19A and 19B, when a semiconductor device of a type having a wiring pattern wherein a lower wide wiring 401 and an upper fine wiring 402 are electrically connected through a contact hole 403 was subjected to a high temperature standing test for evaluating the reliability of the wirings, it was confirmed that the wiring resistance rose, resulting in the phenomenon where electric connection was interrupted. The analysis of defectives resulting from the phenomenon reveals that a portion 404 of Cu disappears or becomes voided at the wide wiring 401 side below the contact hole 403. In this instance, the wide wiring 401 is formed below the contact hole 403, and a similar phenomenon has been confirmed in the case where the wide wiring is formed over the contact hole. More particularly, as shown in FIGS. 20A and 20B, where a semiconductor device having a wiring pattern wherein an upper wide wiring 501 and a low fine wiring 502 are electrically connected through a contact hole 503 was subjected to a high temperature standing test for evaluating the reliability of the wirings, it was confirmed that a voided portion 504 of Cu was found at the inside of the contact hole 503.

Such voiding of Cu is liable to occur when the dimensional relationship between the wiring width of the wide wiring and the diameter of the contact hole satisfies a given range of conditions, especially, in case where the wide wiring and the fine wiring are electrically connected with each other through one contact hole. According to the experiment made by the present inventor, the voiding of Cu was observed when the width of a wiring was at 1.0 μm and the diameter of contact hole connecting thereto was at 0.14 μm. In order to avoid the voiding of Cu, it is effective to set the dimensional relationship between the wide wiring and the contact hole so as not to satisfy such conditions as mentioned above. It should be noted that because many limitation conditions have to be cleared up upon designing a wiring pattern, it is very difficult to optimize the dimensional relationship between the wide wiring and the contact hole while priority is given to the avoidance of the voiding of Cu.

Although how Cu becomes voided is not clear at present, the voiding mechanism is considered as follows: as reported, for example, in "Stress-induced Voiding Under Vias Connected to Wide Cu Metal Leads" (p. 312–321) of "IRPS (International Reliability Physics Symposium) 2002", the voiding of Cu resulting from stress migration, i.e. voids caused by the grain growth in a Cu film, is concentrated at a portion, which is relatively low in bonding (i.e. a portion where stress is released) by the influence of the stress caused by the difference in coefficient of thermal expansion between the wiring film and the insulating film and the stress of the insulating film per se, thereby causing Cu to be voided.

SUMMARY OF THE INVENTION

It is accordingly an object of the invention to provide a method for manufacturing a semiconductor device wherein where a wide wiring and a fine wiring, each made of Cu, are electrically, mutually connected through a contact hole or holes, voiding of Cu can be prevented.

It is another object of the invention to provide a semiconductor device obtained by the method.

According to an aspect of the invention, there is provided a semiconductor device, which includes a first buried wiring, a second buried wiring formed as a layer different from the first buried wiring, a contact hole, which is formed between the first buried wiring and the second buried wiring and is filled or plugged with a wiring material for electrically connecting the first and second buried wirings therethrough, and a dummy hole, which has a hole diameter different from the contact hole, is so formed in vicinity of the contact hole as to connect the first buried wiring, and is filled with a wiring material therein.

In this semiconductor device, because the dummy hole is formed as connecting with the first buried wiring in the vicinity of the contact hole and the dummy hole has a hole diameter different from the contact hole, it becomes possible to concentrate a voided portion of the wiring material at a portion where the dummy hole has been formed by adopting a process utilizing the difference in hole diameter between the contact hole and the dummy hole in the course of manufacturing the semiconductor device.

For instance, where the second buried wiring is formed as an upper layer of the first buried wiring and the dummy hole is formed on the first buried wiring as having a hole diameter larger than the contact hole, the voids created by the disappearance or voiding of Cu can be established in a concentrated manner below the dummy hole. This is enabled to occur such that when a contact hole and a dummy hole are simultaneously formed (or made) by etching over the first buried wiring in the course of the manufacture, an etching damage is given only to the first buried wiring below the dummy hole by the use of the difference in etching rate thereby degrading a property of bonding to the wiring material.

Where the second buried wiring is formed as an upper layer of the first buried wiring and the dummy hole is formed below the first buried wiring as having a hole diameter smaller than the contact hole, where the second buried wiring is formed as a lower layer of the first buried wiring and the dummy hole is formed over the first buried wiring as having a hole diameter smaller than the contact hole, or where the second buried wiring is formed as an upper layer of the first buried wiring and the dummy hole is formed over the first buried wiring as having a hole diameter smaller than the contact hole, the hole diameter of the dummy hole in the respective manufacturing processes is so set as to cause a plugging failure of wiring material thereby forming the dummy hole. This causes a plugging failure to occur when the wiring material is actually filled therein, thus enabling voids caused by the voiding of Cu to be concentratedly produced at a plugging failure portion of the dummy hole.

According to another aspect of the invention, there is provided a method for manufacturing a semiconductor device including a first buried wiring, a second buried wiring formed as an upper layer of the first buried wiring, a contact hole, which is formed between the first buried wiring and the second buried wiring and is filled with a wiring material for permitting electric connection between the first and second buried wirings therewith, and a dummy hole, which is so formed over the first buried wiring in the vicinity of the contact hole and has a hole diameter lager than the contact hole and in which a wiring material is filled. The method includes the steps of forming the first buried wiring, forming an insulating film on the first buried wiring through a diffusion-preventive film and etching the insulating film to simultaneously form the contact hole and the dummy hole in this insulating film so that a surface of the first buried wiring is exposed to at a bottom of the dummy hole, and filling the contact hole and the dummy hole with a wiring material, respectively.

According to this manufacturing method, when the contact hole and the dummy hole are simultaneously formed by etching the insulating film over the first buried wiring, the dummy hole is etched to an extent deeper than the contact hole owing to the difference in etching rate depending on the hole diameter. As a result, the surface of the first buried wiring is exposed to at the bottom of the dummy hole without permitting the surface of the first buried wiring to be exposed at the bottom of the contact hole, thus enabling one to suffer an etching damage thereat. Accordingly, when the wiring material is filled in the contact hole and the dummy hole, respectively, it becomes possible that the adhesion of the wiring material to the bottom of the contact hole relatively increases and the adhesion of the dummy hole at the bottom thereof to the wiring material relatively lowers. Eventually, the voids formed by the voiding of Cu can be produced below the dummy hole in a concentrated manner.

According to a further aspect of the invention, there is also provides a method for manufacturing a semiconductor device including a first buried wiring, a second buried wiring formed as an upper layer of the first buried wiring, a contact hole, which is formed between the first buried wiring and the second buried wiring for electric connection therebetween and is filled with a wiring material, and a dummy hole, which is formed below the first buried wiring in the vicinity of the contact hole and has a hole diameter smaller than the contact hole and in which a wiring material is plugged or filled. The method includes the steps of forming a wring groove for forming the first buried wiring and forming the dummy hole below the wiring groove in such a size as to cause a plugging failure when a wiring material is filled in the dummy hole, burying the dummy hole and the wiring groove with a wiring material, and forming a contact hole over the first buried wiring that has been formed by the filling of the wiring material and filling the contact hole with a wiring material.

In the manufacturing method of this semiconductor device, the dummy hole is formed below the wiring groove for forming the first buried wiring in such a size as to cause a plugging failure of the wiring material, so that the plugging failure takes place inside the dummy hole upon plugging of the wiring material into the dummy hole. Accordingly, with the semiconductor device obtained by the method, the voids caused by the voiding of Cu can be concentratedly produced at a plugging failure portion inside the dummy hole, thereby making it possible to avoid the voiding of Cu in the contact hole.

According to a still further aspect of the invention, there is also provides a method for manufacturing a semiconductor device including a first buried wiring, a second buried wiring formed as a lower layer of the first buried wiring, a contact hole, which is formed between the first buried wiring and the second buried wiring and is filled with a wiring material for electrically connecting the first and second buried wirings therewith, and a dummy hole, which is formed below the first buried wiring in the vicinity of the contact hole and has a hole diameter smaller than the contact hole and in which a wiring material is filled. The method includes the steps of forming the second buried wiring, forming the contact hole and the dummy hole over the second buried wiring in such a size as to cause a plugging failure when a wiring material is filled in the dummy hole, forming a groove for wiring for forming the first buried wiring in such a condition as to be electrically connected with the contact hole and the dummy hole, and burying a wiring material in the contact hole, the dummy hole, and the groove for wiring, respectively.

In the manufacturing method of the semiconductor device, when the contact hole and dummy hole are formed over the second buried wiring, the dummy hole is so formed as to cause a plugging failure of the wiring material. Accordingly, when the wiring material is filled in the dummy hole, a plugging failure occurs inside the dummy hole. Accordingly, with the semiconductor device obtained by such a method, voids caused by voiding of Cu can be concentratedly produced at a plugging failure portion within the dummy hole, making it possible to avoid the voiding of Cu inside the contact hole.

According to a yet further aspect of the invention, there is provided a method for manufacturing a semiconductor device including a first buried wiring, a second buried wiring formed as an upper layer of the first buried wiring, a contact hole, which is formed between the first buried wiring and the second buried wiring and is filled with a wiring material for electrically connecting the first and second buried wirings therewith, and a dummy hole, which is formed over the first buried wiring in the vicinity of the contact hole and has a hole diameter smaller than the contact hole and in which a wiring material is filled. The method includes the steps of forming the first buried wiring, forming the contact hole and a dummy pattern over the first buried wiring in such a size as to cause a plugging failure when a wiring material is filled in the dummy hole, forming a groove for wiring over the first buried wiring for forming the second buried wiring in such a condition as to be electrically connected with the contact hole and the dummy pattern, and filling a wiring material in the contact hole, the dummy hole, and the groove for wiring, respectively.

In this manufacturing method of the semiconductor device, the dummy hole is formed in such a size as to cause a plugging failure of wiring material when the contact hole and the dummy pattern are formed over the first buried wiring. When the dummy hole is filled with a wiring material, the plugging failure occurs in the dummy hole. Accordingly, with the semiconductor device obtained by this method, the voids resulting from the voiding of Cu are produced at the plugging failure portion within the dummy hole, thereby ensuring the avoidance of Cu voiding in the contact hole.

BRIEF DESCRIPTION OF THE DRAWINGS

These and other objects of the invention will be seen by reference to the description, taken in connection with the accompanying drawing, in which.

DETAILED DESCRIPTION OF THE PREFERRED EMBODIMENTS

The embodiments of the invention are described in detail with reference to the accompanying drawings.

[First Embodiment]

The method of manufacturing a semiconductor device according to a first embodiment of the invention and also an arrangement of the semiconductor device obtained by the method are illustrated with reference to FIGS. 1A, 1B, and 1C to FIG. 6.

Figure 1A:
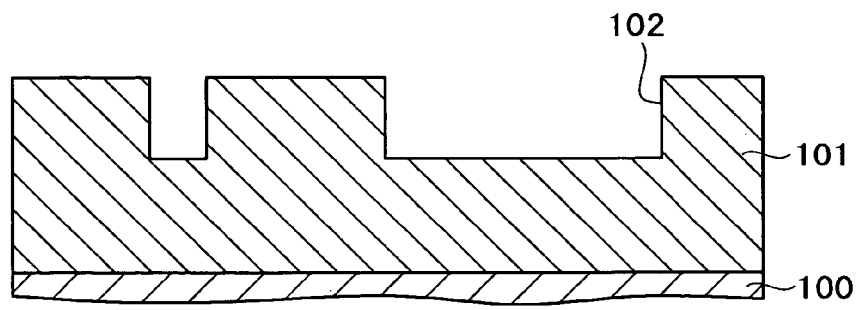
FIGS. 1A to 1C are, respectively, a schematic view (sequence 1) illustrating a method of manufacturing a semiconductor device and an arrangement of the device according to a first embodiment of the invention.

Initially, as shown in FIG. 1A, a given element (not shown) is formed on a silicon substrate 100 and this silicon substrate 100 is covered with an insulating film 101 made, for example, of $SiO_2$, under which a groove 102 for wiring used to form a first buried wiring is formed in the insulating film 101 according to a desired pattern. The wiring grove 102 is formed, simultaneously with grooving for other wiring potions formed in the same layer as the first buried wiring, according to known lithographic and etching techniques. The depth of the wiring groove 102 is, for example, at 200 nm.

Figure 1B:
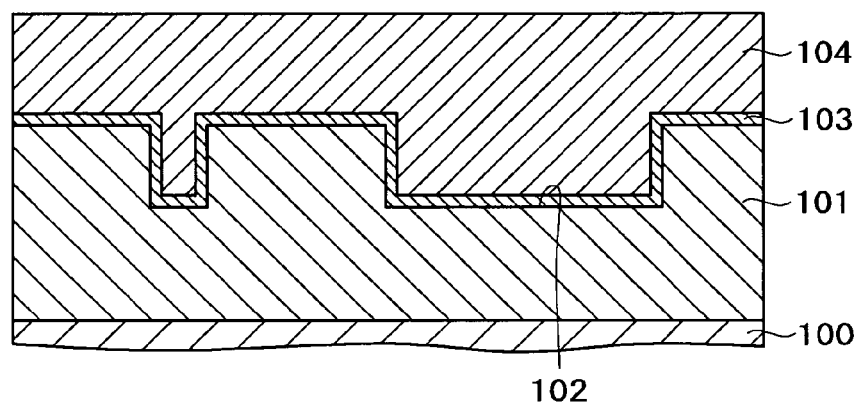

Next, as shown in FIG. 1B, a wiring layer is formed on the insulating film 101 by forming a barrier metal 103 made, for example, of Ta (tantalum) to cover the surface (i.e. the entire surface) of the insulating film 101 and depositing a Cu wiring material 104 over the insulating film 101 through the barrier metal 103, thereby burying the wiring groove 102 with the Cu wiring material 104. The Cu wiring material 104 is buried, for example, by forming on the barrier metal 103 an 80 nm thick seed layer of Cu by a sputtering method and depositing a 700 nm thick Cu skin layer by an electroplating technique. For a Cu burying technique, a Chemical Vapor Deposition (CVD) method may be used.

Figure 1C:
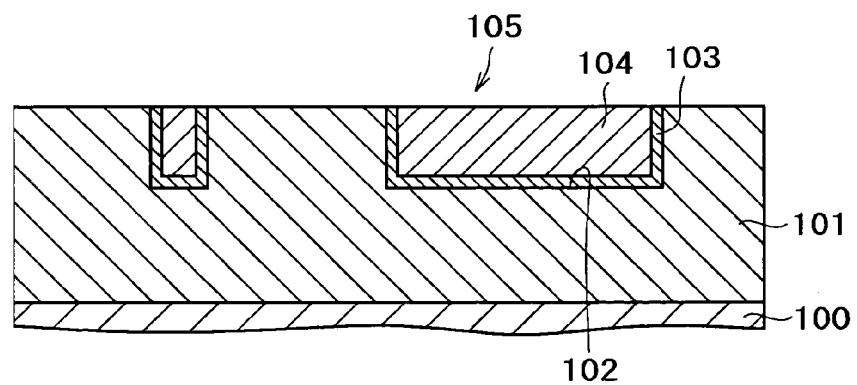

Thereafter, as shown in FIG. 1C, an additional portion of the Cu wiring material 104 is removed by polishing according to a CMP (Chemical Mechanical Polishing) method until the insulating film 101 is exposed to on the surface thereof. In this way, the Cu wiring material 104 is left as being buried in the wiring groove 102 and other groove portions located in the same layer as the groove. At this time, a first buried wiring 105 is formed in such a state that the Cu wiring material 104 is buried in the wiring groove 102 through the barrier metal 103. The first buried wiring 105 is formed as a wide wring whose width is larger than a second buried wiring described hereinafter.

Figure 2A:
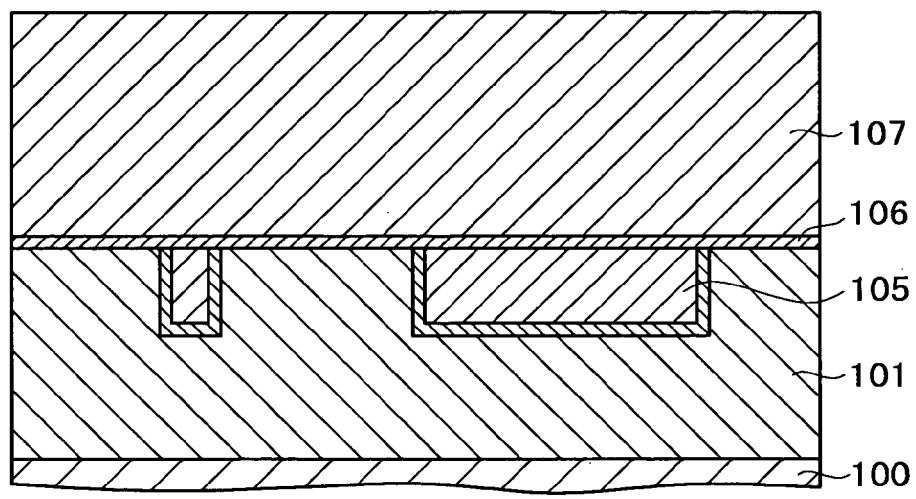
FIGS. 2A and 2B are, respectively, a schematic view (sequence 2) illustrating a method of manufacturing a semiconductor device and an arrangement of the device according to the first embodiment of the invention.

Subsequently, as shown in FIG. 2A, a 50 nm thick SiC film serving as a Cu diffusion preventive film 106 is formed over the insulating film 101 and the first buried wiring 105, followed by further formation of an insulating film (layer insulating film) 107 in a thickness, for example, of 600 nm for insulating a wiring layer, in which the first buried wiring 105 is formed, from a wiring layer formed as an upper layer for the first-mentioned wiring layer.

Figure 2B:
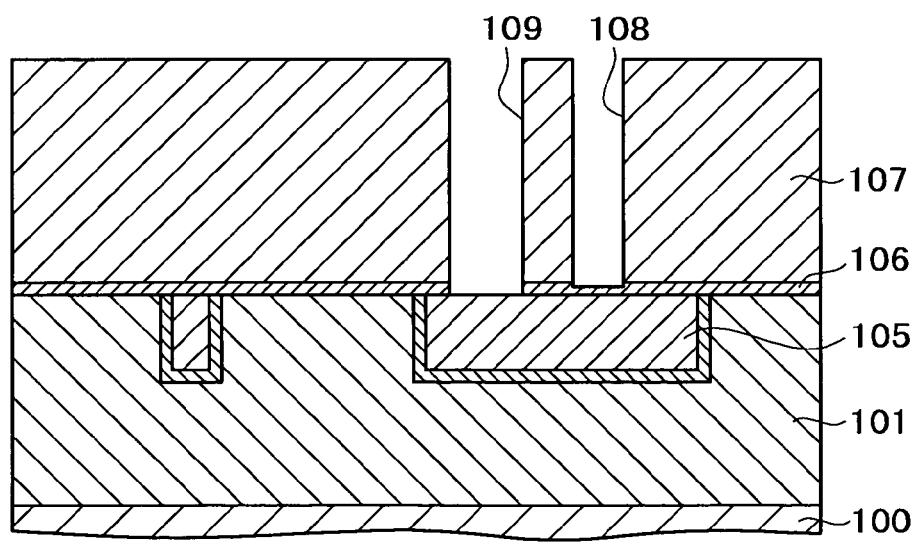

Next, as shown in FIG. 2B, a contact hole 108 and a dummy hole 109 are simultaneously formed in the insulating film 107 over the first buried wiring 105 according to a lithographic technique and an etching technique, so that the surface of the first buried wiring 105 is exposed at the bottom of the dummy hole 109. At this stage, the contact hole 108 and the dummy hole 109 are, respectively, formed singly while keeping the holes away from each other, for example, by approximately 1 μm in terms of a central pitch of the holes so that the dummy hole 109 is located in the vicinity of the contact hole 108.

In the present specification, the term "contact hole" is formed between the first buried wiring and the second buried wiring for establishing electric connection between the first buried wiring and the second buried wiring formed in different layers, respectively. On the other hand, the term "dummy hole" in the present invention does not influence any circuit operation when a conduction path within the dummy hole is broken down. More particularly, the dummy hole may include a hole in which a wiring material is filled, under which the hole is formed as electrically floated without connection to any portion other than the first buried wiring, or a dummy wiring, which is connected to wirings other than the first buried wiring but the connected wirings are in an electrically floated state, or a hole formed between the first buried wiring and the second buried wiring along with the contact hole. Moreover, the term "vicinity of contact hole" means a dimensional range, for example, from the center of a contact hole to a position determined by 20 times the diameter of the contact hole. In the "vicinity of contact hole", it is favorable to form a dummy hole at a position closest to the contact hole.

Where a hole is made in the insulating film 107 by a dry etching technique such as plasma etching, the dummy hole 109 becomes greater in etching rate than the contact hole, for which the dummy hole 109 is formed as having a hole diameter larger than the contact hole 108 in coincidence with a pattern shape used for preceding resist patterning.

An instance of etching conditions applied to hole making is shown.

Flow rate of $C_4F_8$ gas: 2 sccm
Flow rate of Ar gas: 1000 sccm
Flow rate of $N_2$ gas: 160 sccm Under these etching conditions, the etching rate depends greatly on the hole diameter by decreasing the flow rate of C4F8 gas contributing to etching relative to ordinarily employed etching conditions. The diameter of the dummy hole 109 is set, for example, at 0.2 μm so that the surface of the first buried wiring 105 located as a lower layer is exposed to by etching.

When the contact hole 108 and the dummy hole 109 are etched simultaneously under these conditions, the dummy hole 109 is inevitably formed more deeply than the contact hole 108. Thus, an appropriate control such as of an etching time and the like ensures, as shown in FIG. 2B, such a state that the surface of the first buried wiring 105 is not exposed to because of the diffusion-preventive film 106 being left at the bottom of the contact hole 108, whereas the surface of the first buried wiring 105 is exposed at the bottom of the dummy hole 109 wherein the diffusion-preventive film 106 is removed (by etching). In this state, the exposed portion of the first buried wiring 105 suffers a serious etching damage through the dummy hole.

Figure 3A:
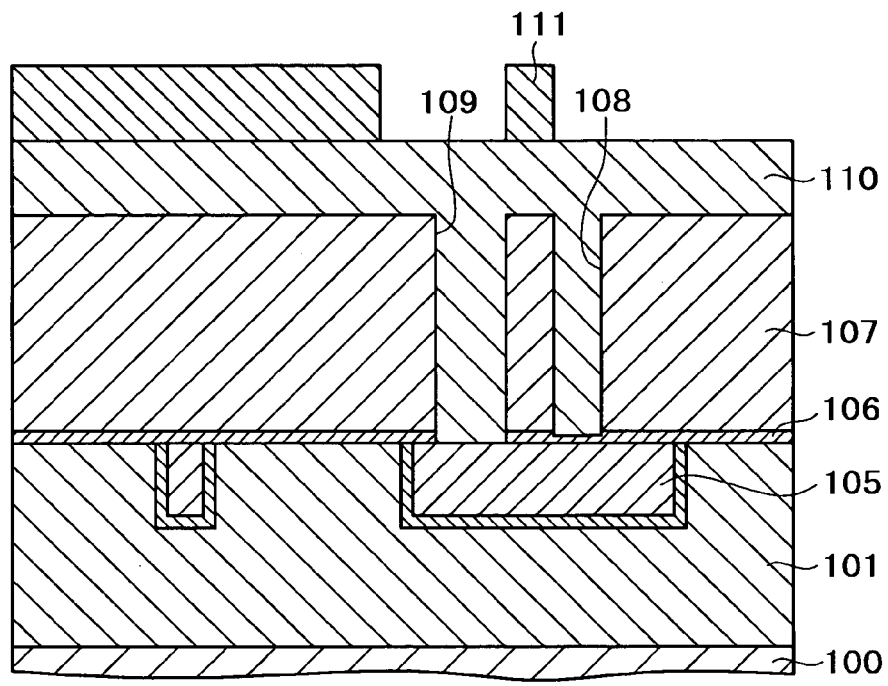
FIGS. 3A and 3B are, respectively, a schematic view (sequence 3) illustrating a method of manufacturing a semiconductor device and an arrangement of the device according to the first embodiment of the invention.

Subsequently, as shown in FIG. 3A, a resist 110 is applied onto the insulating film 107, so that the contact hole 108 and the dummy hole 109 are, respectively, filled up with the resist 110, followed by applying another type of resist 111 onto the resist 110 and patterning.

Figure 3B:
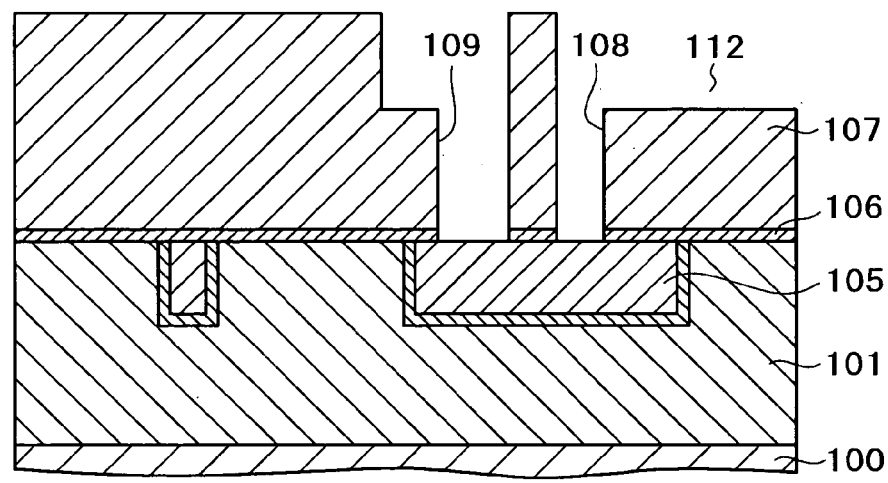

Next, as shown in FIG. 3B, the resist 110 and the insulating film 107 are subjected to grooving through the mask of the resist 111 by an etching technique to form a wiring groove 112 for forming a second buried wiring at a depth, for example, of 300 nm. The resists 110, 111 left on the insulating film 107 are removed. Next, the diffusion preventive film 106 left at the bottom of the contact hole 108 is removed by etching to expose the surface of the first buried wiring 105 at the bottom of the contact hole 108. In this manner, the contact hole 108 and the dummy hole 109 are in such a state as to connect the first buried wiring 105.

Figure 4A:
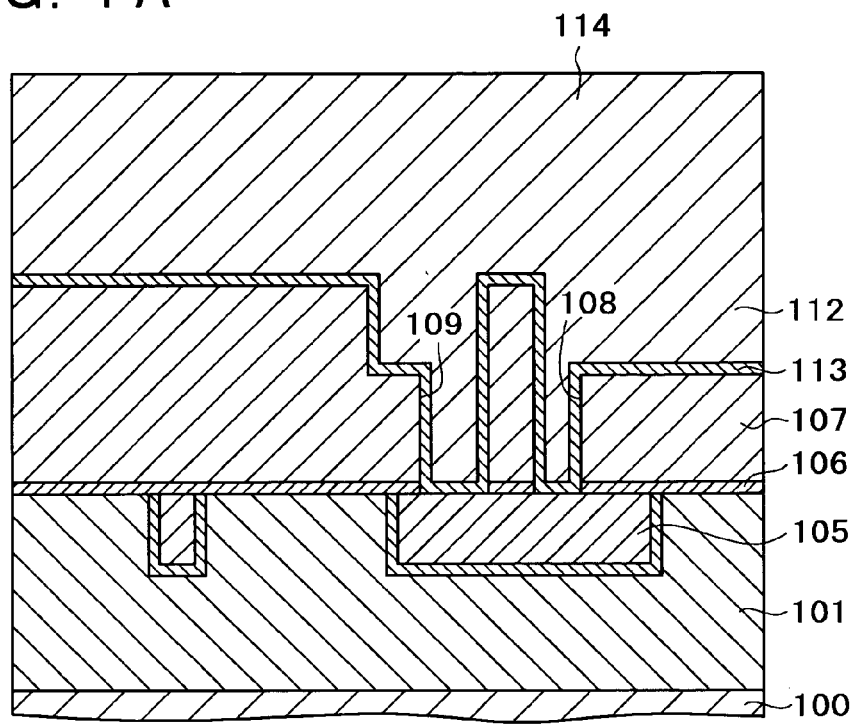
FIGS. 4A and 4B are, respectively, a schematic view (sequence 4) illustrating a method of manufacturing a semiconductor device and an arrangement of the device according to the first embodiment of the invention.

Next, as shown in FIG. 4A, a wiring layer is formed on the insulating film 107, for example, by covering the surface of the insulating film 107 (part of which includes the surface of the first buried wiring 105) with a barrier metal 113 made of Ta in the same manner as set out hereinabove, followed by deposition of a Cu wiring material 114 over the insulating film 107 through this barrier metal 113 to fill the contact hole 108 and the dummy hole 109 with the Cu wiring material 114 simultaneously with the wiring groove 112. The Cu wiring material 114 is buried, for example, by forming an 80 nm thick Cu seed layer on the barrier metal 113 by a sputtering method and depositing an 800 nm thick Cu skin layer by an electroplating technique.

Figure 4B:
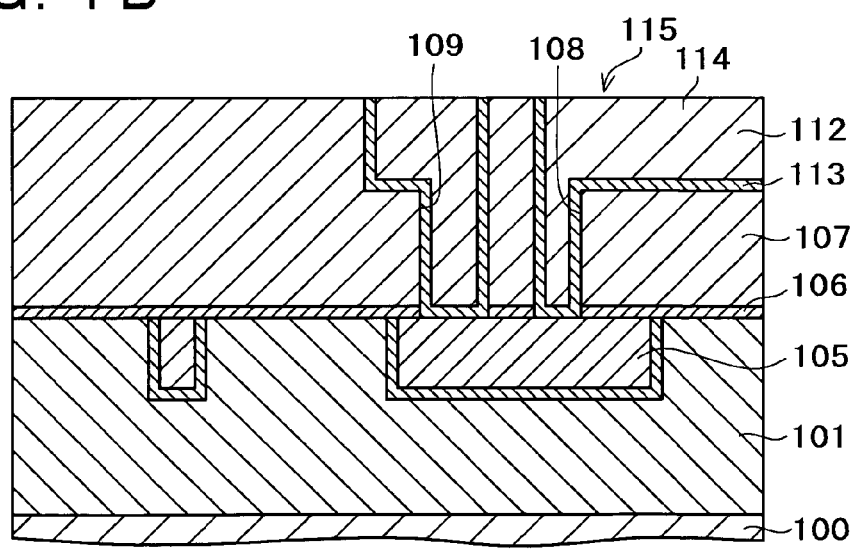

Thereafter, as shown in FIG. 4B, an additional Cu wiring material 114 is removed by polishing according to a CMP method to expose the surface of the insulating film 107. In this way, the Cu wiring material 114 is left as buried in the wiring groove 112 and only at the groove portions of the same layer as the wiring groove 112. At this time, the second buried wiring 115 is formed in such a state that the Cu wiring material 114 is buried in the wiring groove 112 through the barrier metal 115. The second buried wiring 115 is formed at an upper layer of the first buried wiring 105 stated hereinabove as a fine wiring whose width is smaller than the first buried wiring 105.

Figure 5:
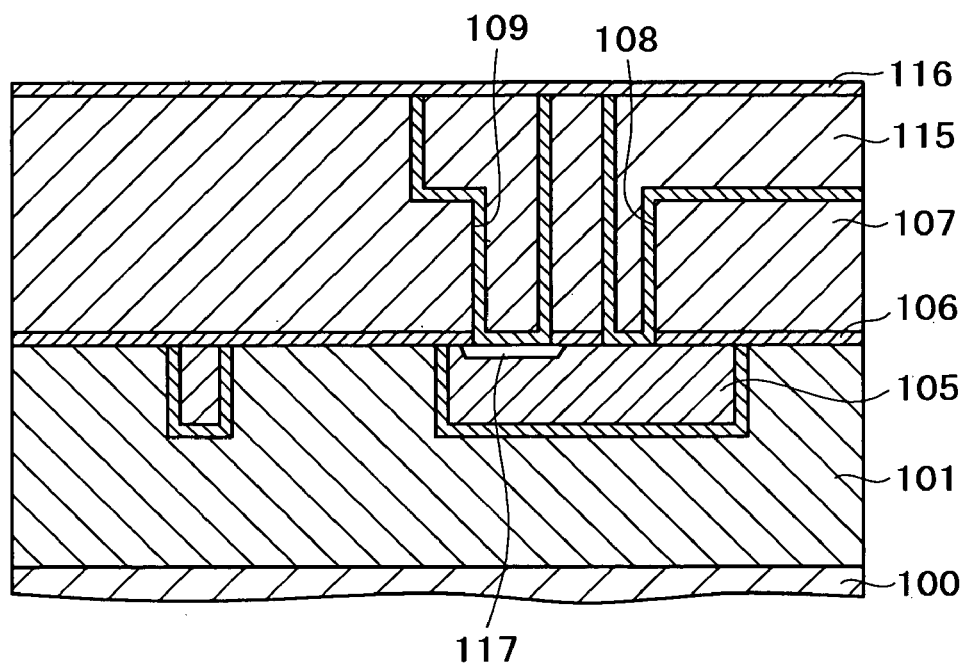
FIG. 5 is a schematic view (sequence 5) illustrating a method of manufacturing a semiconductor device and an arrangement of the device according to the first embodiment of the invention.
Figure 6:
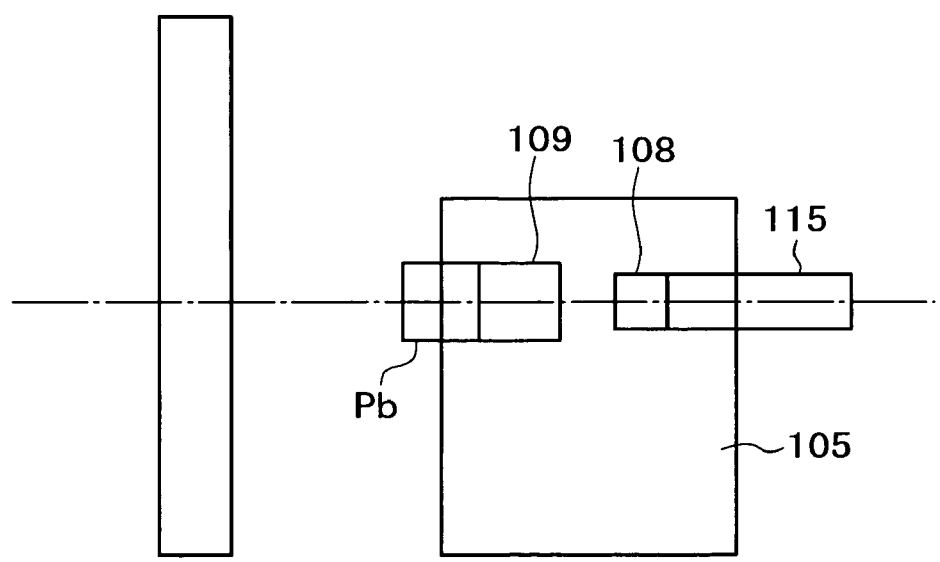
FIG. 6 is a schematic view (sequence 6) illustrating a method of manufacturing a semiconductor device and an arrangement of the device according to the first embodiment of the invention.

Subsequently, as shown in FIG. 5, a 50 nm thick SiC film is formed, as a Cu diffusion preventive film 116, over the insulating film 107 and the second buried wiring 115. By the formation, when viewing a wiring pattern on the silicon substrate 100 perspectively in plan, the second buried wiring 115 is formed in such a state as to be superposed as an upper layer of the first buried wiring 105 and the contact hole 108 having substantially the same size as the width of the second buried wiring 115 is formed at the end of the second buried wiring 115, as is particularly shown in FIG. 6. Over the first buried wiring 105, the contact hole 108 and the dummy hole 109 are formed adjacently to each other. Subsequently, an insulating layer, wiring layers, and the like are formed in similar procedures as set forth hereinbefore, thereby forming a multi-layered wiring over the silicon substrate 100. It will be noted that a wiring pattern Dp (FIG. 6) arranged in the same layer as the second buried wiring 115 is formed as covering the dummy hole 109, and this wiring pattern Dp is a dummy wiring pattern that does not contribute to circuit operations at all and may not be essential.

In the thus obtained semiconductor device, the second buried wiring 115 is formed as an upper layer relative to the first buried wiring 105, the contact hole 108 is formed between the first buried wiring 105 and the second buried wiring 115, and the dummy hole 109 is formed as having a hole diameter larger than the contact hole 108 over the first buried wiring 105. In addition, the Cu wiring materials 104, 114 (see FIGS. 1, 4) are, respectively, filled in the contact hole 108 and the dummy hole 109.

In the semiconductor device having such an arrangement as set out hereinabove, relative comparison in adhesion between the physical connection between the contact hole 108 and the first buried wiring 105 and the physical connection between the dummy hole 109 and the first buried wiring 105 reveals that the former is better (becomes stronger) in the adhesion than the latter. The reason for this is considered as follows: in the hole making through etching, the surface of the first buried wiring 105 is exposed to at the bottom of the dummy hole 109, and the exposed portion suffers a great damage through etching, thereby causing the adhesion to be worsened. In contrast, the voiding of Cu (voids) caused by stress migration concentratedly occurs beginning at a portion of low adhesion. Thus, with the semiconductor device of the above-stated arrangement, as shown in FIG. 5, the void 117 caused by the voiding of Cu concentratedly becomes developed at the bottom of the dummy hole 109 over the first buried wiring 105. Thus, because stress is released through the occurrence of the void 107 at the dummy hole 109, the occurrence of the void through the voiding of Cu can be reliably avoided at the inside of the contact hole 108 located in the vicinity of the dummy hole 109, at the connecting portion between the contact hole 108 and the first buried wiring 105 and also at the connecting portion between the contact hole 108 and the second buried wiring 115. Eventually, a rise in wiring resistance between the first buried wiring 105 and the second buried wiring 115 or a failure of disconnection can be kept from occurring, and thus, good electric connection between the first buried wiring 105 and the second buried wiring 115 can also be kept.

When a high temperature standing test of 200° C. and 1000 hours was carried out by use of the semiconductor device according to the first embodiment of the invention, a void caused by the voiding of Cu was found at the bottom of the dummy hole 109, and no voiding of Cu was observed at the inside of the contact hole 108 for ensuring electric connection and also at the connection between the first buried wiring 105 and the second buried wiring 115.

[Second Embodiment]

Reference is now made to FIGS. 7 to 12 for illustrating a method for manufacturing a semiconductor device according to a second embodiment of the invention and also the semiconductor device obtained by the method.

Figure 7A:
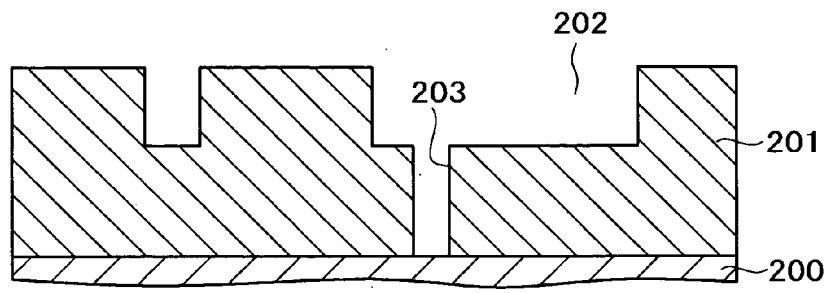
FIGS. 7A to 7C are, respectively, a schematic view (sequence 1) illustrating a method of manufacturing a semiconductor device and an arrangement of the device according to a second embodiment of the invention.

First, as shown in FIG. 7A, given elements and the like (not shown) are formed on a silicon substrate 200. The silicon substrate 200 is covered with an insulating film 201 made, for example, of $SiO_2$, under which a groove 202 for wiring used to from a first buried wiring is formed on the insulating film 201 according to a desired wiring pattern, and one dummy hole 203 is formed below this wiring groove 202 in a state of permitting electric connection with the wiring groove 202. The wiring groove 202 is formed according to lithographic and etching techniques well known in the art simultaneously with grooving for other wiring portions to be formed in the same layer as the first buried wiring. The depth of the wiring groove 202 is, for example, at 300 nm. On the other hand, a dummy hole 203 is formed by making a hole within the wiring groove 202 in a size (e.g. 0.12 µm) sufficient to cause a plug defect (void) of a wiring material when a Cu wiring material described hereinafter is buried in the dummy hole 203. More particularly, when a Cu wiring material described hereinafter is buried, the diameter of the dummy hole is so set as to intentionally cause a plugging failure within the dummy hole 203. The plugging failure of a wiring material is more liable to occur at a larger depth (or at a larger aspect ratio) of the dummy hole 203. Thus, it is necessary to set the degree of a plugging failure of a Cu wiring material (i.e. a hole diameter) in relation with the depth of the dummy hole 203.

Figure 7B:
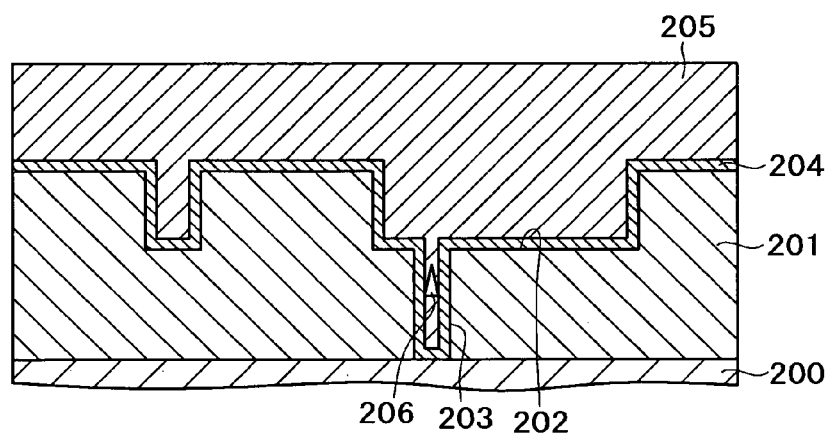

Next, in order to form a wiring layer on the insulating film 201 as shown in FIG. 7B, a barrier metal 204 made, for example, of Ta (tantalum) is formed to cover a surface (entire surface) of the insulating film 201 therewith, after which a Cu wiring material 205 is deposited on the insulating film 201 through the barrier metal 204 to bury the Cu wiring material 205 in the wiring groove 202 and the dummy hole 203. The Cu wiring material 205 is buried by forming an 80 nm thick Cu seed layer on the barrier metal 204 by a sputtering method and depositing a Cu skin layer in a thickness of 700 nm according to an electroplating method. At this stage, the degree of burying of the Cu wiring material 205 in the dummy hole 203 lowers owing to the small hole diameter (or a large aspect ratio). This does not bring about complete filling of the Cu wiring material 205 inside the dummy hole 203, with the result that a void 206 occurs inside the dummy hole 203.

Figure 7C:
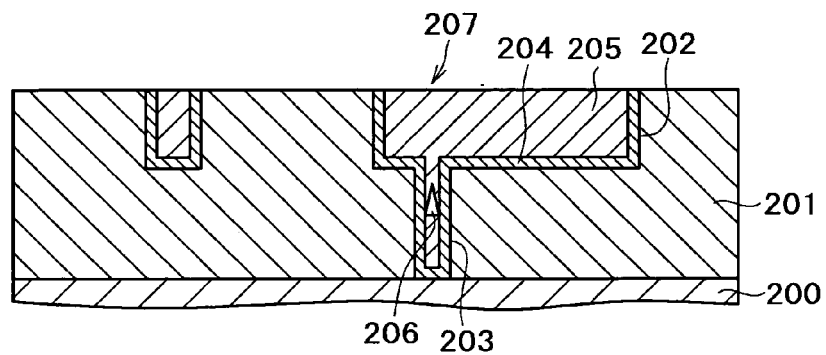

Next, as shown in FIG. 7C, an additional Cu wiring material 205 is removed by polishing according to the CMP method until the surface of the insulating film 201 is exposed. In this way, the Cu wiring material 205 is left as buried only in the dummy hole 203 and the wiring groove 202 along with grooved portions in the same layer as the wiring groove 202. At this time, a first buried wiring 207 is formed such that the Cu wiring material 205 is buried in the wiring groove 202 through the barrier metal 204. The first buried wiring 207 is formed as a wide wiring whose width is larger than a second buried wiring described hereinafter. The dummy hole 203 is formed beneath the first buried wiring 207.

Figure 8A:
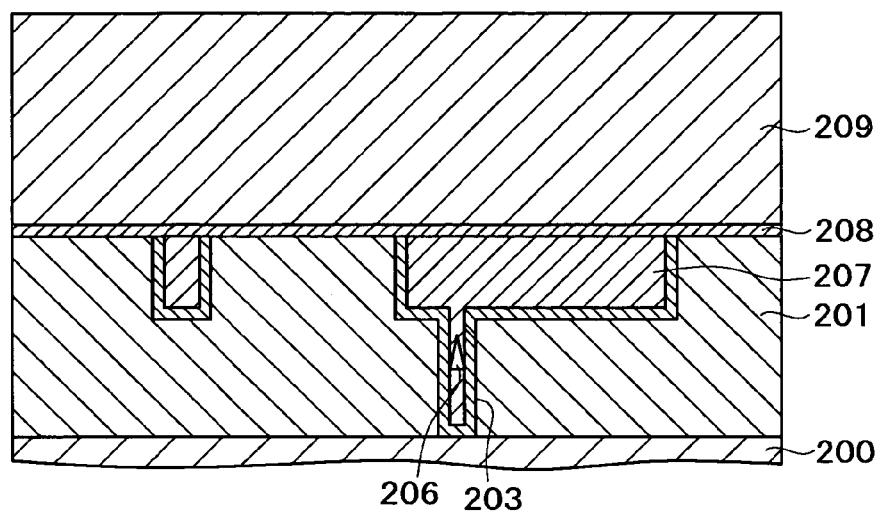
FIGS. 8A and 8B are, respectively, a schematic view (sequence 2) illustrating a method of manufacturing a semiconductor device and an arrangement of the device according to the second embodiment of the invention.

Subsequently, as shown n FIG. 8A, a 50 nm thick SiC film is formed, as a Cu diffusion preventive film 208, over the insulating film 201 and the first buried wiring 207, after which an insulating layer (layer insulating film) 209 is formed in a thickness, for example, of 600 nm in order to insulate the wiring layer, in which the first buried wiring 207 is formed, from a wiring layer formed as an upper layer.

Figure 8B:
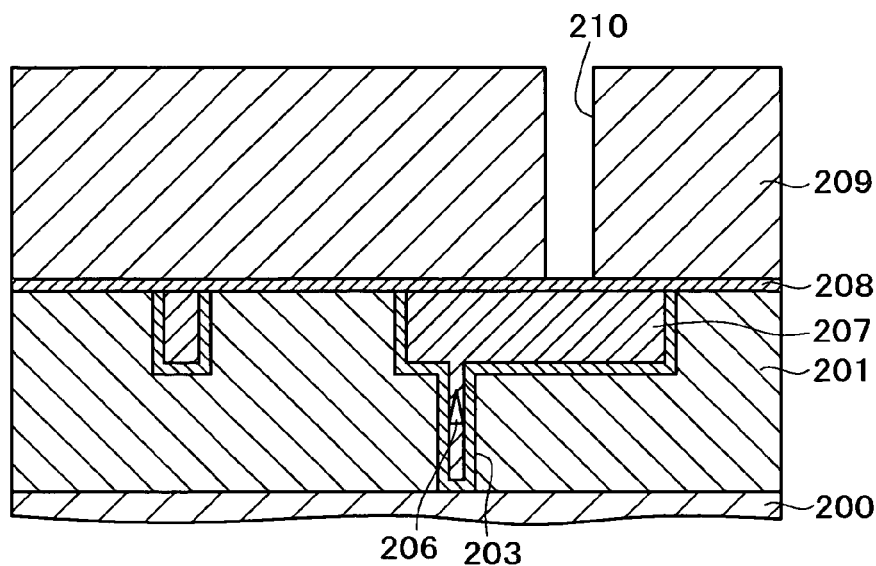

Next, as shown in FIG. 8B, the insulating film 209 is subjected to lithographic and etching (dry etching) techniques over the first buried wiring 207 to form a contact hole 210. The contact hole 210 is so formed as to be kept away from the dummy hole 203 by a distance of about 1 µm in terms of center pitch so that the dummy hole 203 is provided in the vicinity of the contact hole 210. The diffusion preventive film 208 is left at the bottom of the contact hole 210, and the first buried wiring 207 is not exposed to at the surface thereof.

Figure 9A:
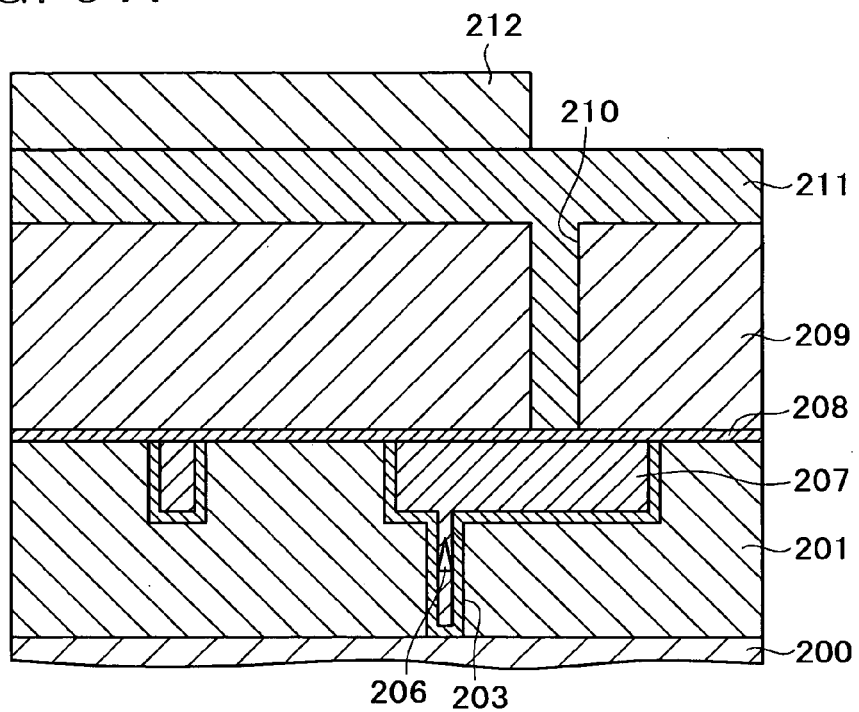
FIGS. 9A and 9B are, respectively, a schematic view (sequence 3) illustrating a method of manufacturing a semiconductor device and an arrangement of the device according to the second embodiment of the invention.

Subsequently, as shown in FIG. 9A, a resist 211 is applied onto the insulating film 209 to bury the contact hole 210 with the resist 211, followed by further application of another type of resist 212 on the resist 210 and patterning.

Figure 9B:
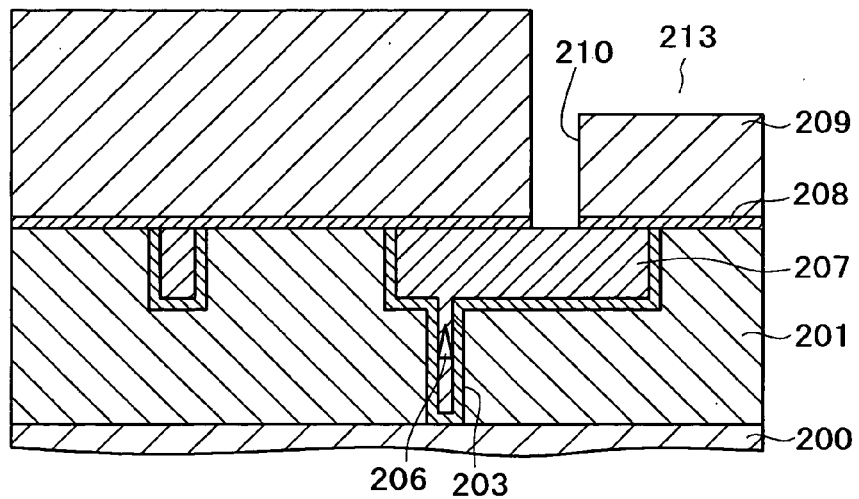

Next, as shown in FIG. 9B, the resist 211 and the insulating film 209 are grooved by an etching method through the mask of the resist 212 pattern thereby forming a wiring groove 213 for forming a second buried wiring at a depth, for example, of 300 nm, followed by removing the resists 211, 212 from the insulating film 209. Thereafter, the diffusion preventive film 208, which is left at the bottom of the contact hole 210, is removed by etching thereby causing the surface of the first buried wiring 207 to be exposed to at the bottom of the contact hole 210. In this way, the contact hole 210 is formed over the first buried wiring 207 in communication with the first buried wiring 207.

Figure 10A:
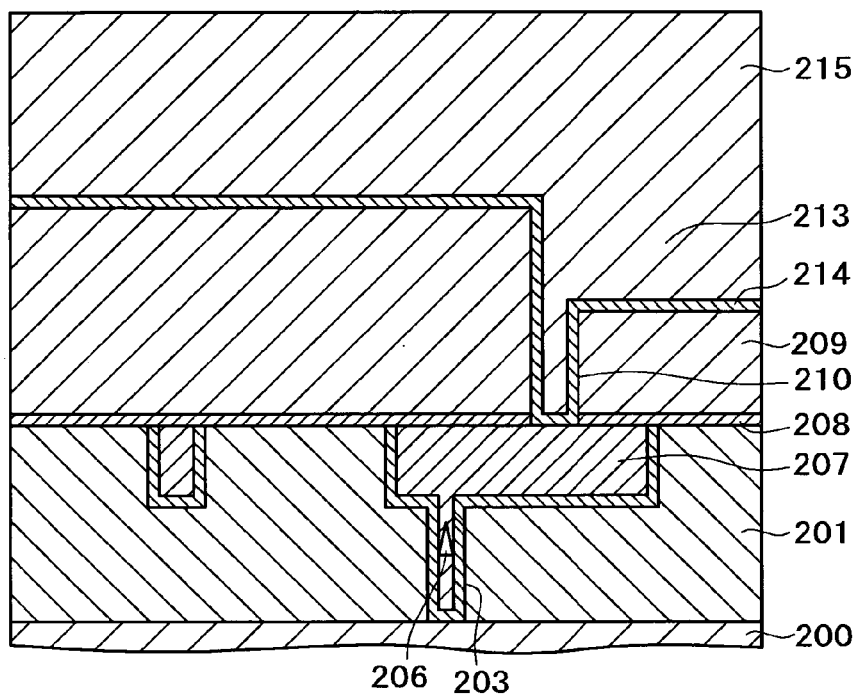
FIGS. 10A and 10B are, respectively, a schematic view (sequence 4) illustrating a method of manufacturing a semiconductor device and an arrangement of the device according to the second embodiment of the invention.

Next, as shown in FIG. 10A, a wiring layer is formed on the insulating 209 by forming a barrier metal 214 made, for example, of Ta as set out hereinabove, to cover the surface (part of which includes a surface of the first buried wiring 207) of the insulating film 209, and a Cu wiring material 215 is deposited over the insulating film 209 through this barrier metal 214 to bury the wiring groove 213 with the Cu wiring material 215. The Cu wiring material 215 is buried, for example, by forming a Cu sheet layer on the barrier metal 214 in a thickness of 80 nm by a sputtering method, followed by deposition of a Cu skin layer in a thickness of 800 nm by electroplating.

Figure 10B:
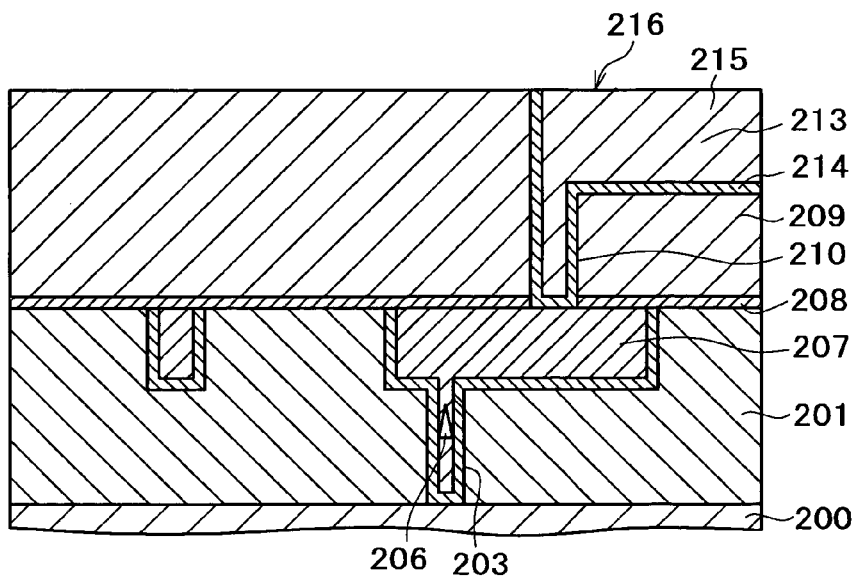

Next, as shown in FIG. 10B, an additional Cu wiring material 215 is removed by polishing according to the CMP method to expose the insulating film 209 to at the surface thereof. In this manner, the Cu wiring material 215 is left as buried in the wiring groove 213 and grooved portions in the same layer as the groove 213. At this time, the second buried wiring 216 is formed while the Cu wiring material 215 is buried in the wiring groove 213 through the barrier metal 214. The second buried wiring 216 is formed as a fine wiring whose width is smaller than the first buried wiring 207 as an upper layer of the first buried wiring 207.

Figure 11:
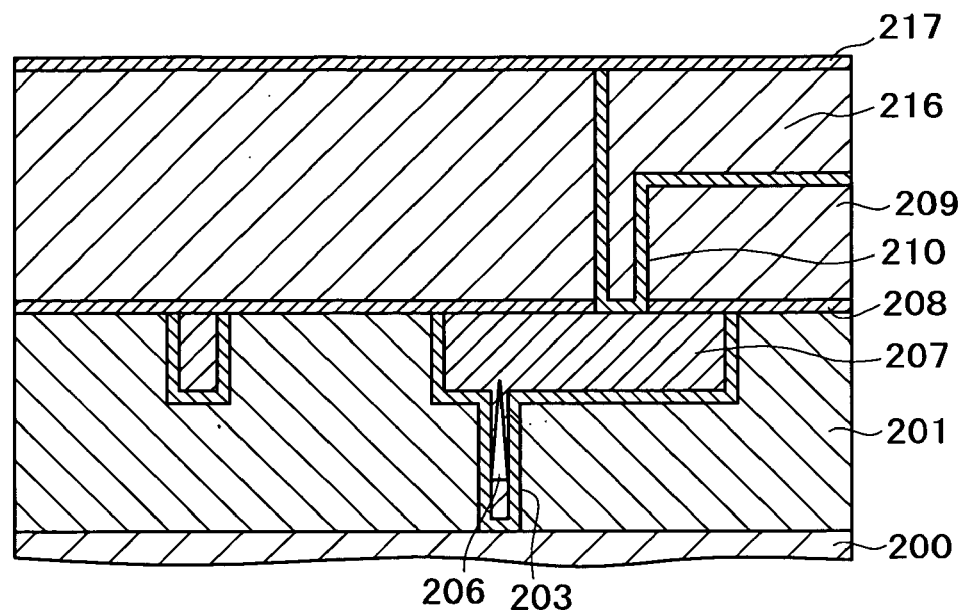
FIG. 11 is a schematic view (sequence 5) illustrating a method of manufacturing a semiconductor device and an arrangement of the device according to the second embodiment of the invention.
Figure 12:
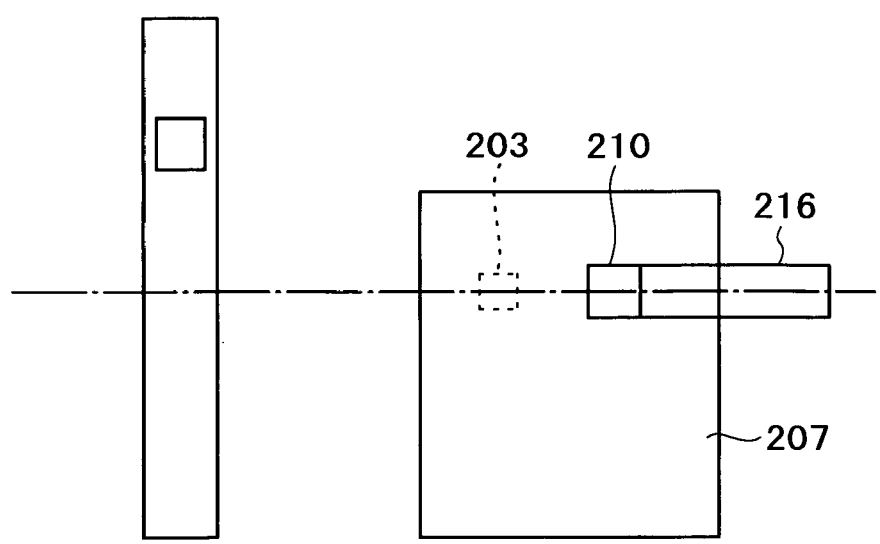
FIG. 12 is a schematic view (sequence 6) illustrating a method of manufacturing a semiconductor device and an arrangement of the device according to the second embodiment of the invention.

Subsequently, as shown in FIG. 11, a 50 nm thick SiC film is formed, as a Cu diffusion preventive film 217, over the insulating film 209 and the second buried wiring 216. When viewing the wiring pattern over the silicon substrate 200 perspectively in plan, the second buried wiring 216 is formed in such a state as to be superposed as an upper layer of the first buried wiring 207 and the contact hole 210 having substantially the same size as the width of the second buried wiring 216 is formed at the end of the second buried wiring 216, as is particularly shown in FIG. 12. Over the first buried wiring 207, the contact hole 210 and the dummy hole 203 are formed adjacently to each other. Subsequently, an insulating layer, wiring layers, and the like are formed in similar procedures as set forth hereinbefore, thereby forming a multi-layered wiring over the silicon substrate 200.

In the thus obtained semiconductor device, the second buried wiring 216 is formed as an upper layer relative to the first buried wiring 207, the contact hole 210 is formed between the first buried wiring 207 and the second buried wiring 216, and the dummy hole 203 is formed as having a hole diameter smaller than the contact hole 210 below the first buried wiring 207. In addition, the Cu wiring materials 205, 215 (see FIGS. 7, 10) are, respectively, filled in the contact hole 210 and the dummy hole 203.

In the semiconductor device having such an arrangement as set out hereinabove, the dummy hole 203 has in the inside thereof the void 206 caused by the plugging failure of the Cu wiring material, so that the voiding (void) of Cu based on the stress migration is concentratedly produced at a portion of the void 206. Thus, with the semiconductor device having such an arrangement as set forth hereinabove, as shown in FIG. 11, although the void 206 caused by the voiding of Cu inside the dummy hole 203 becomes great in size, stress is released by this. Thus, the occurrence of a void based on the voiding of Cu can be reliably avoided at the inside of the contact hole 210 located in the vicinity of the dummy hole 203, at the connecting portion between the contact hole 210 and the first buried wiring 207, and also at the connecting portion between the contact hole 210 and the second buried wiring 210. Eventually, a rise in wiring resistance between the first buried wiring 207 and the second buried wiring 216 or disconnection failure thereof can be kept from occurring, and thus, good electric connection between the first buried wiring 207 and the second buried wiring 216 can also be kept.

When a high temperature standing test of 200° C. and 1000 hours was carried out by use of the semiconductor device according to the second embodiment of the invention, a void 206 within the dummy hole 203 became large but no voiding of Cu was observed at the inside of the contact hole 210 for ensuring electric connection and at the connecting portion of the first buried wiring 207 and also of the second buried wiring 216, both in connection with the contact hole 210.

It will be noted that when the diameter of the dummy hole 203 is so set as to allow the plugging failure to occur, the etching rate in the course of hole making becomes small, so that if a wiring layer exists below the dummy hole 203, the dummy hole 203 is not considered to actually arrive at the lower wiring layer at the bottom thereof. In such a case, the position of forming the dummy hole 203 can be arbitrarily determined without taking the lower wiring pattern into consideration.

[Third Embodiment]

Reference is now made to FIGS. 13 to 18 to illustrate a method for manufacturing a semiconductor device according to a third embodiment of the invention and also the semiconductor device obtained by the method.

Figure 13A:
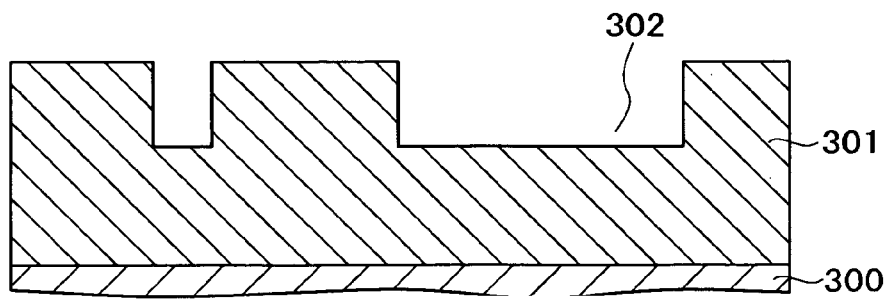
FIGS. 13A to 13C are, respectively, a schematic view (sequence 1) illustrating a method of manufacturing a semiconductor device and an arrangement of the device according to a third embodiment of the invention.

First, as shown in FIG. 13A, given elements and the like (not shown) are formed on a silicon substrate 300. The silicon substrate 300 is covered with an insulating film 301 made, for example, of $SiO_2$, under which a groove 302 for wiring used to from a second buried wiring is formed on the insulating film 301 according to a desired wiring pattern.

The wiring groove 302 is formed according to lithographic and etching techniques well known in the art simultaneously with grooving for other wiring portions to be formed in the same layer as the second buried wiring. The depth of the wiring groove 302 is, for example, at 300 nm.

Figure 13B:
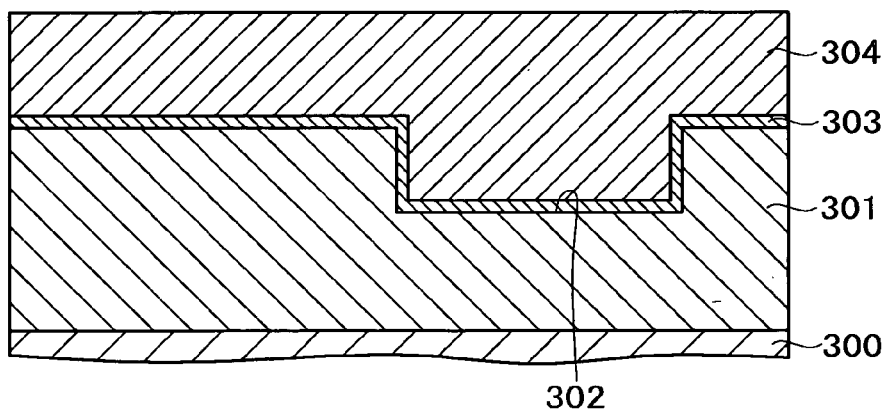

Next, in order to form a wiring layer on the insulating film 301 as shown in FIG. 13B, a barrier metal 303 made, for example, of Ta (tantalum) is formed to cover a surface (entire surface) of the insulating film 301 therewith, after which a Cu wiring material 304 is deposited on the insulating film 301 through the barrier metal 303 thereby burying the wiring groove 302 with the Cu wiring material 304. The Cu wiring material 304 is buried by forming an 80 nm thick Cu seed layer on the barrier metal 303 by a sputtering method and deposing a Cu skin layer in a thickness of 700 nm according to an electroplating method.

Figure 13C:
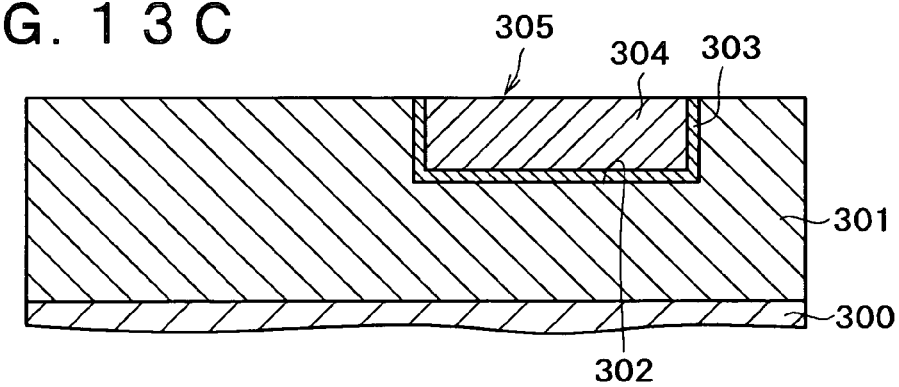

Next, as shown in FIG. 13C, an additional Cu wiring material 304 is removed by polishing according to the CMP method until the surface of the insulating film 301 is exposed. In this way, the Cu wiring material 304 is left as buried only in the wiring groove 302 along with grooved portions in the same layer as the wiring groove 302. At this time, a second buried wiring 305 is formed in such a state that the Cu wiring material 304 is buried in the wiring groove 302 through the barrier metal 303. The second buried wiring 305 is formed as a fine wiring whose width is smaller than a first buried wiring described hereinafter.

Figure 14A:
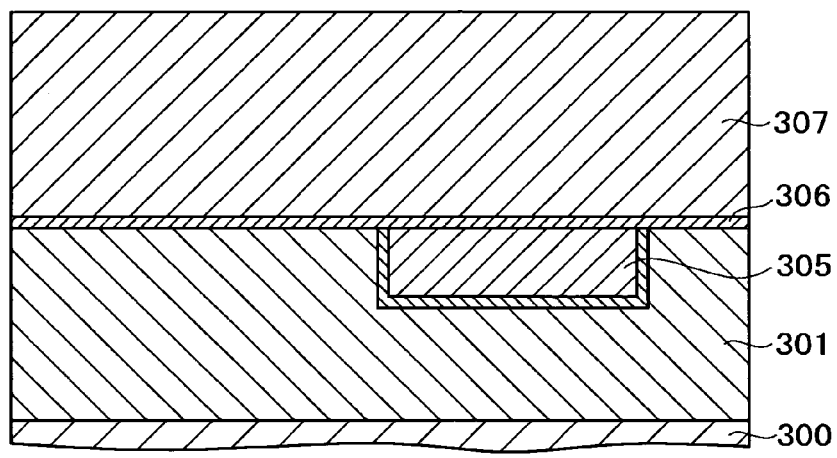
FIGS. 14A and 14B are, respectively, a schematic view (sequence 2) illustrating a method of manufacturing a semiconductor device and an arrangement of the device according to the third embodiment of the invention.

Subsequently, as shown n FIG. 14A, a 50 nm thick SiC film is formed, as a Cu diffusion preventive film 306, over the insulating film 301 and the second buried wiring 305, after which an insulating layer (layer insulating film) 307 is formed in a thickness, for example, of 600 nm in order to insulate the wiring layer, in which the second buried wiring 305 is formed, from a wiring layer formed as an upper layer.

Figure 14B:
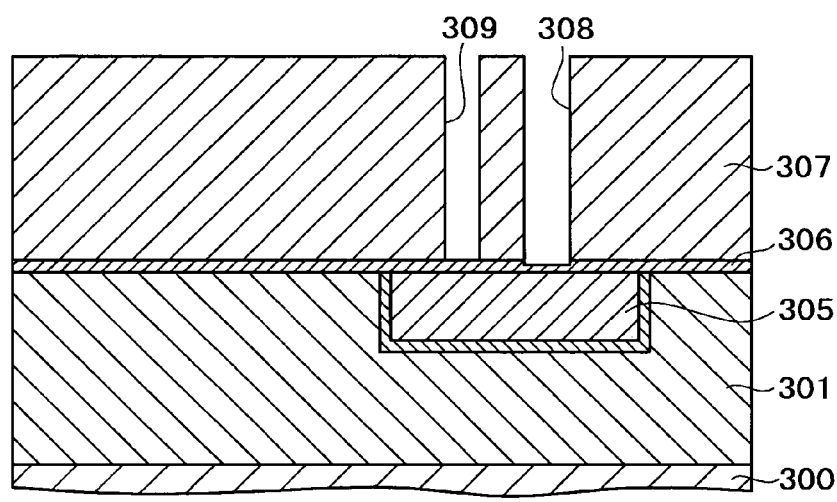

Next, as shown in FIG. 14B, the insulating film 307 is subjected to lithographic and etching techniques over the second buried wiring 305 to form a contact hole 308 and a dummy hole 309 at the same time. At this time, the contact hole 308 and the dummy hole 309 are formed one by one so as to be kept away from each other by a distance of about 1 μm in terms of center pitch so that the dummy hole 309 is positioned in the vicinity of the contact hole 308. The diffusion preventive film 306 is left at the bottom of the contact hole 308 and the dummy hole 309 at the bottom thereof, respectively, so that the surface of the second buried wiring 305 is not exposed to. The dummy hole 309 is formed as having a diameter larger than the contact hole 308. More particularly, although the contact hole 308 is formed in a size not causing a plugging failure (void) when a Cu wiring material described hereinafter is filled in the contact hole 308, the dummy hole 309 is formed, on the contrary, in a size (e.g. 0.12 μm) sufficient to cause a plugging failure (void) when a Cu wiring material is filled in the dummy hole 309. More particularly, when the Cu wiring material described hereinafter is filled in, the diameter of the dummy hole 309 is so set as to intentionally cause a plugging failure within the dummy hole 309. The plugging failure of wiring material is more liable to occur when the dummy hole 309 becomes deeper (or an aspect ratio becomes larger). Accordingly, the size (i.e. a hole diameter), which is sufficient to cause a plugging failure of a Cu wiring material, should be set in relation with the depth of the dummy hole 309.

Figure 15A:
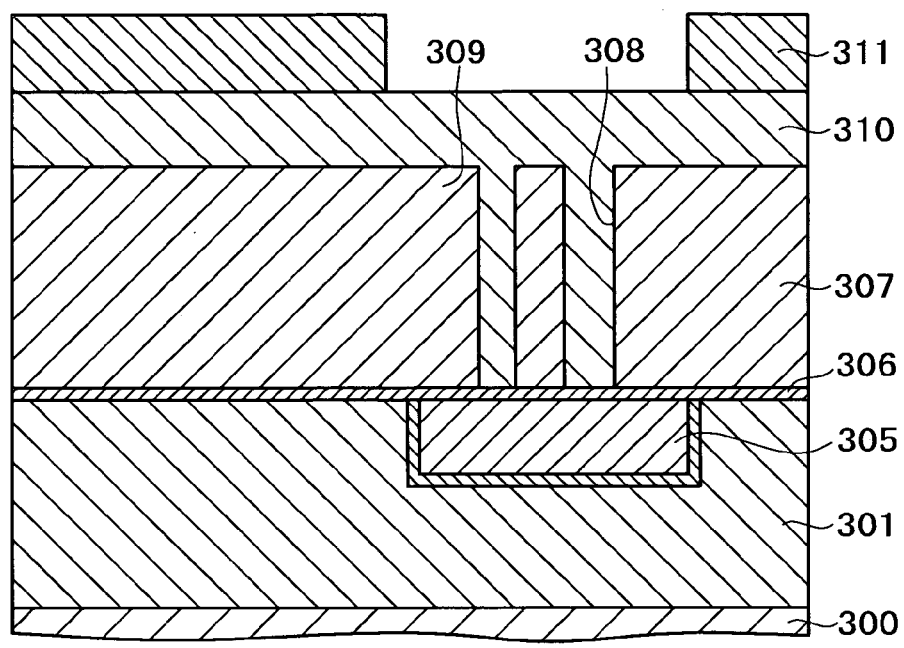
FIGS. 15A and 15B are, respectively, a schematic view (sequence 3) illustrating a method of manufacturing a semiconductor device and an arrangement of the device according to the third embodiment of the invention.

Subsequently, as shown in FIG. 15A, a resist 310 is applied onto the insulating film 307 to fill the contact hole 308 and the dummy hole 309 with the resist 310, followed by further application of another type of resist 311 on the resist 310 and patterning.

Figure 15B:
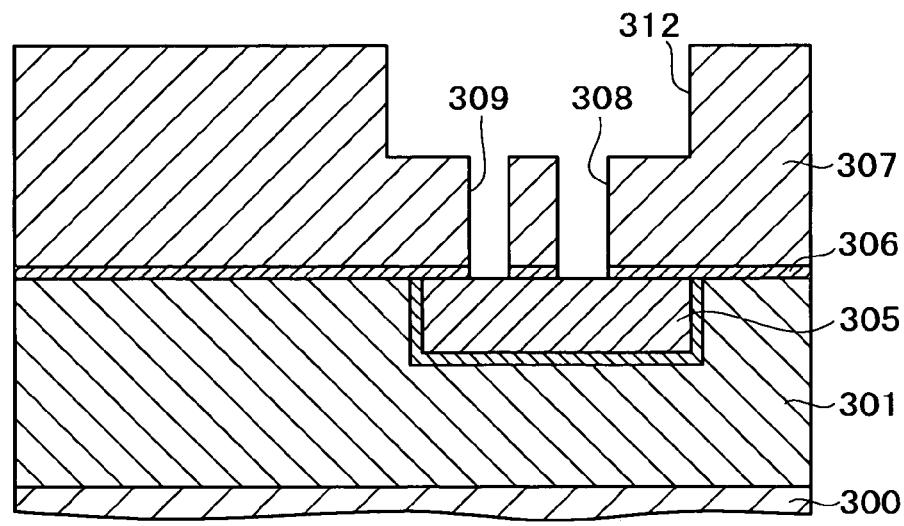

Next, as shown in FIG. 15B, the resist 310 and the insulating film 307 are, respectively, grooved through a mask of the resist 311 pattern by etching to from a wiring groove 312 for forming a first buried wiring at a depth, for example, of 300 nm, followed by removing the resists 310, 311 left on the insulating film 307. Next, the diffusion preventive film 306 remaining at the bottoms of the contact hole 308 and the dummy hole 309 is removed by etching to permit the surface of the second buried wiring 305 to be exposed at the bottoms of the contact hole 308 and the dummy hole 309. In this way, the contact hole 308 and the dummy hole 309 are, respectively, communicated with the second buried wiring 305.

Figure 16A:
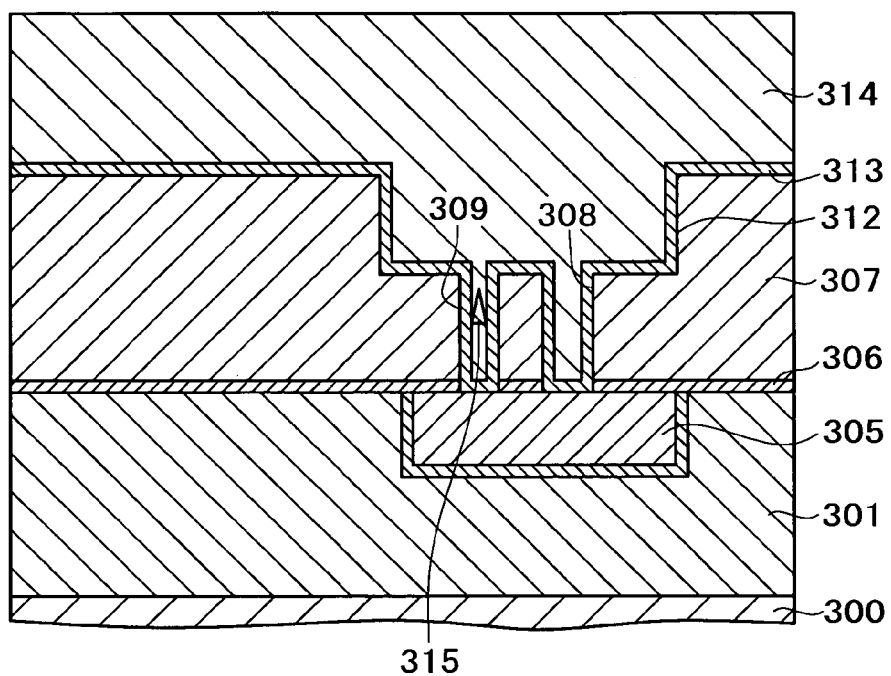
FIGS. 16A and 16B are, respectively, a schematic view (sequence 4) illustrating a method of manufacturing a semiconductor device and an arrangement of the device according to the third embodiment of the invention.

Next, as shown in FIG. 16A, in order to form a wiring layer on the insulating film 307, a barrier metal 313 made, for example, of Ta as set out hereinbefore is formed to cover the surface of the insulating film 307 (part of which includes a surface of the second buried wiring 305) therewith, after which a Cu wiring material 314 is deposited over the insulating film 307 through the barrier metal 313 to fill the contact hole 308 and the dummy hole 309 with the Cu wiring material 314 simultaneously with the wiring groove 312. The Cu wiring material 314 is buried or plugged, for example, by forming an 80 nm thick Cu seed layer by a sputtering method and depositing an 800 nm thick Cu skin layer by electroplating method. At this time, the degree of filling of the Cu wiring material becomes low owing to its small diameter (i.e. a great aspect ratio) in the inside of the dummy hole 309. Thus, the dummy hole 309 is not fully filled up with the Cu wiring material 314, eventually causing a void 315 to be produced inside the dummy hole 309.

Figure 16B:
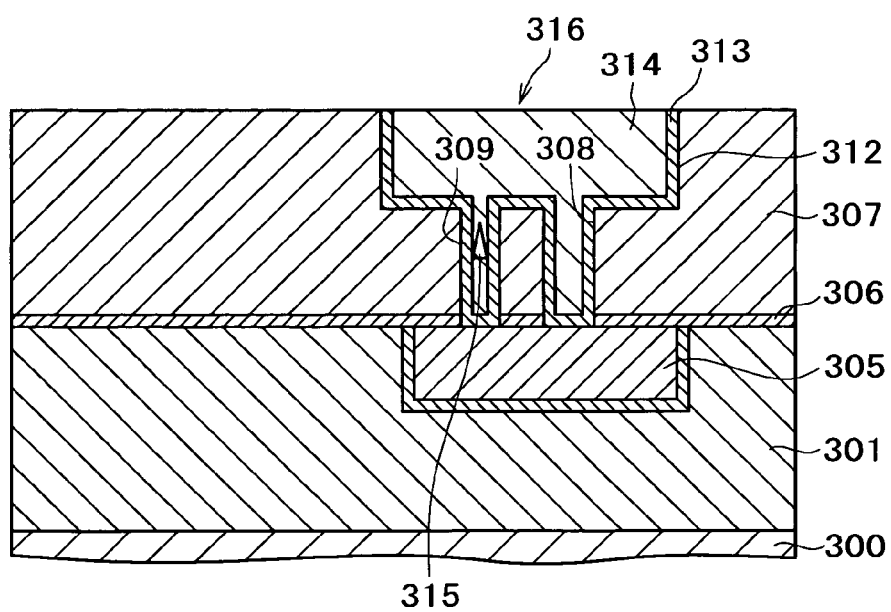

Next, as shown in FIG. 16B, an additional Cu wiring material 314 is removed by polishing according to the CMP method to permit the surface of the insulating film 307 to be exposed. In this way, the Cu wiring material 314 is left as buried only in the wiring groove 312 and also in grooved portions in the same layer as the groove 312. At this stage, a first buried wiring 316 is formed in a state where the Cu wiring material 314 is buried in the wiring groove 312 through the barrier metal 313. The first buried wiring 316 is formed as a wide wiring whose width is larger than the second buried wiring 305 as an upper layer of the second buried wiring 305.

Figure 17:
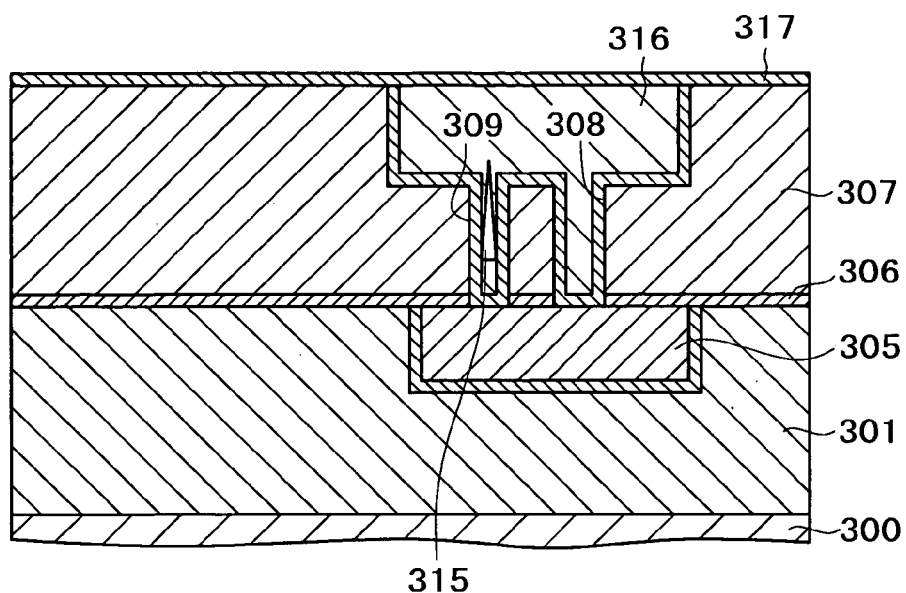
FIG. 17 is a schematic view (sequence 5) illustrating a method of manufacturing a semiconductor device and an arrangement of the device according to the third embodiment of the invention.
Figure 18:
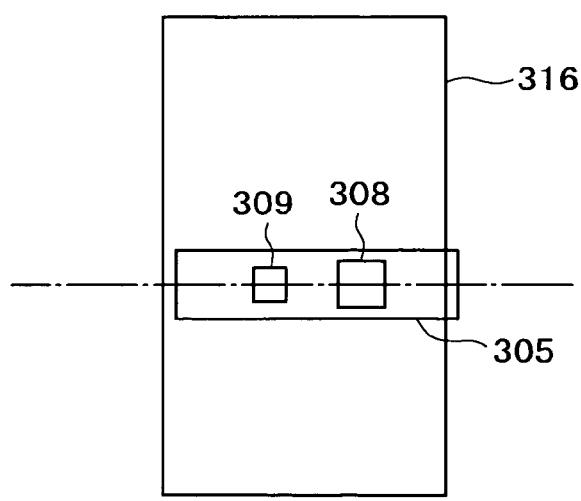
FIG. 18 is a schematic view (sequence 6) illustrating a method of manufacturing a semiconductor device and an arrangement of the device according to the third embodiment of the invention.
Figure 19A:
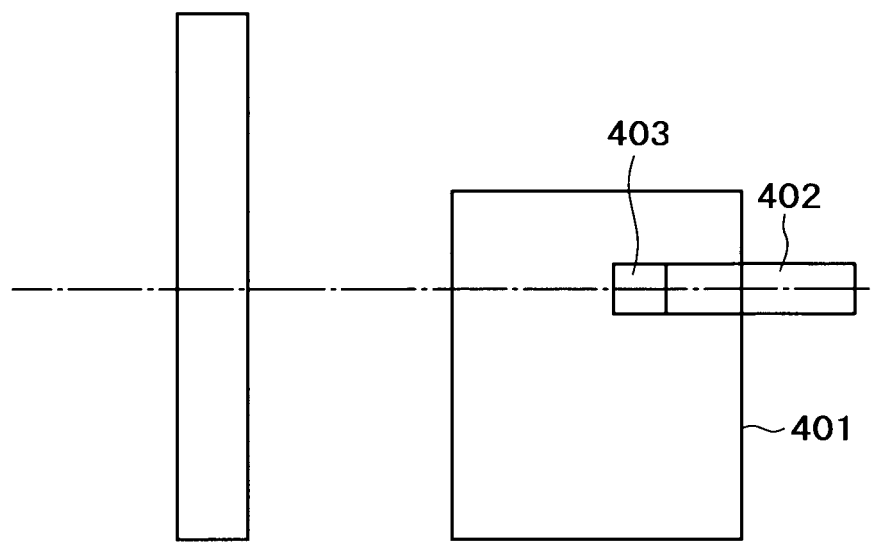
FIGS. 19A and 19B are, respectively, a schematic view illustrating the problem involved in a related art technique (sequence 1)
Figure 19B:
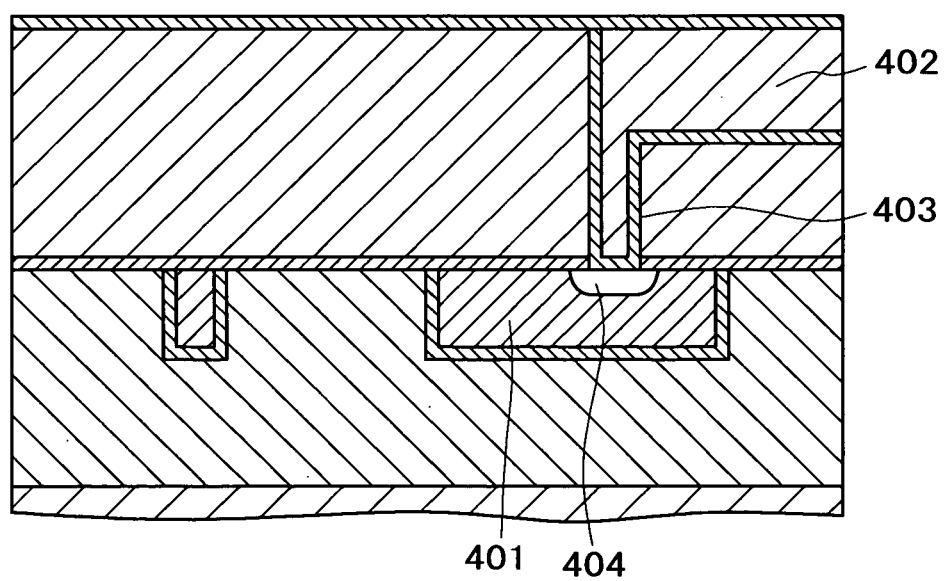
Figure 20A:
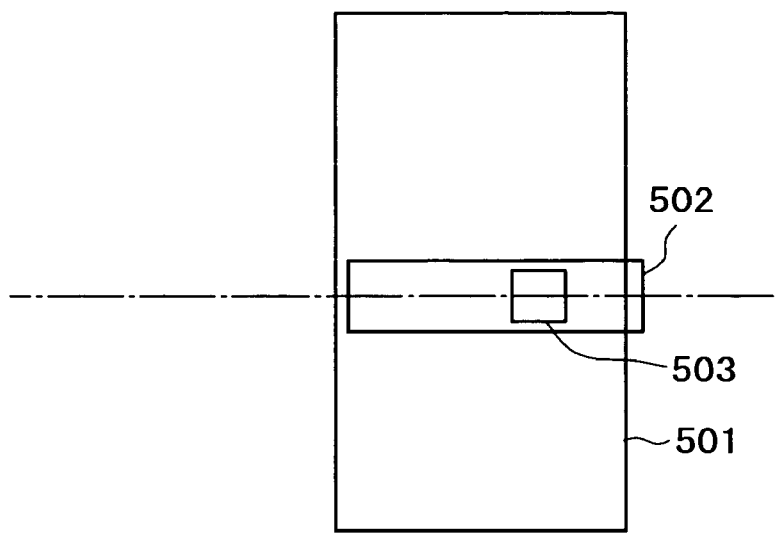
FIGS. 20A and 20B are, respectively, a schematic view illustrating the problem of the related art technique (sequence 2).
Figure 20B:
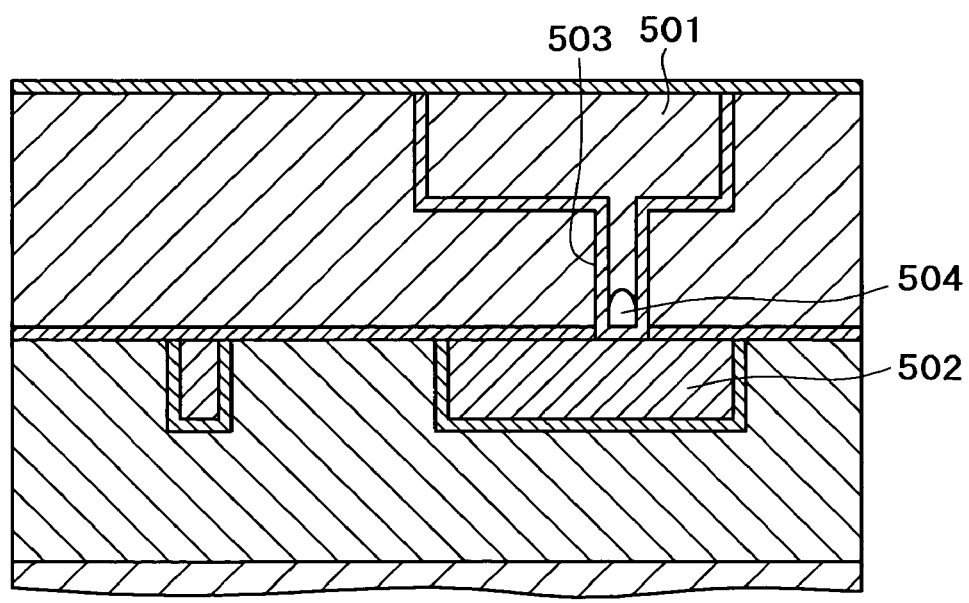

Subsequently, as shown in FIG. 17, a 50 nm thick SiC film is formed, as a Cu diffusion preventive film 317, over the insulating film 307 and the first buried wiring 316. When the wiring pattering over the silicon substrate 300 is viewed perspectively in plan, the first buried wiring 316 is formed as superposed as an upper layer of the second buried wiring 305, and the contact hole 308 and the dummy hole 309 are formed adjacently to each other at the superposed portion. Subsequently, an insulating layer, wiring layers, and the like are formed in the same manner as set forth hereinbefore to form a multi-layered wiring over the silicon substrate 300.

In the semiconductor device obtained in this manner, the second buried wiring 305 is formed as a lower layer of the first buried wiring 316, the contact hole 308 and the dummy hole 309 are both formed between the first buried wiring 316 and the second buried wiring 305, and the dummy hole 309 is formed below the first buried wiring 316 in such a state that its diameter is smaller than that of the contact hole 308. In addition, the contact hole 308 and the dummy hole 309 are, respectively, filled with Cu wiring materials 304, 314 (see FIGS. 13 and 16).

In the semiconductor device such an arrangement as described hereinbefore, a void 315 exists inside the dummy hole 309 owing to the plugging failure of the Cu wiring material, so that the voiding of Cu (a void) caused by stress migration is concentratedly developed at the portion of the void 315. Thus, with the semiconductor device of the arrangement set out hereinbefore, although the void becomes large inside the dummy hole 309 owing to the voiding of Cu as shown in FIG. 17, stress is released through the formation of the void, the development of the void caused by the voiding of Cu can be reliably avoided at the inside of the contact hole 308 located in the vicinity of the dummy hole 309, at the connecting portion between the contact hole 308 and the first buried wiring 316, and also at the connecting portion between the contact hole 308 and the second buried wiring 305. As a result, a rise in wiring resistance and a failure of disconnection between the first buried wiring 316 and the second buried wiring 305 can be prevented from occurring, and electric connection between the first buried wiring 316 and the second buried wiring 305 can be well kept.

Using the semiconductor device according to the third embodiment of the invention, a high temperature standing test of 200° C. and 1000 hours was carried out, revealing that although the void 315 became larger within the dummy hole 309, no voiding of Cu was observed at the inside of the contact hole 308 ensuring electric conduction, at the connecting portion of the first buried wiring 316 in communication with the contact hole 308, and also at the connecting portion of the second buried wiring 305.

It will be noted that when the dummy hole 309 is so set in diameter as to cause a plugging failure, the etching rate for hole making becomes smaller in comparison with a case for an ordinary contact hole, so that it is considered that if a wiring layer exists below the dummy hole 309, the bottom of the dummy hole 309 may not arrive at the lower wiring layer. In such case, the forming position of the dummy hole 309 can be arbitrarily determined without taking the lower wiring pattern into consideration.

In the third embodiment, the case where the second buried wiring 305 is formed as a lower layer of the first buried wiring 316 has been illustrated. If these positional relationships are reversed, e.g. where the lower wiring 305 is provided as the first buried wiring (wide wiring) and the upper wiring 316 is provided as the second buried wiring (fine wiring), similar results are obtained. In this case, the semiconductor device is so arranged that the second buried wiring is formed as an upper layer of the first buried wiring and the dummy hole is formed over the first buried wiring as having a diameter smaller than that of the contact hole. With respect to the manufacturing method of the semiconductor device, only the width of wiring groves for forming the respective wirings is changed, and a fundamental procedure is similar to the case of the third embodiment. More particularly, the method includes the steps of forming a first buried wiring, forming a contact hole and a dummy hole over the first buried wiring so that the dummy hole has a diameter sufficient to cause a plugging failure when a wiring material is filled therein, forming a wiring groove for forming a second buried wiring over the first buried wiring so as to permit communication with the contact hole and dummy hole, and filling a wiring material (Cu) in the contact hole and dummy hole along with the wiring groove.

In the first to third embodiments, although the first buried wiring is provided as a wide wiring and he second buried wiring is provide as a fine wiring, the voiding of Cu ascribed to stress migration depends mainly on the relation of the wiring width and the hole diameter and may be generated inside the contact hole or at the lower wiring side at the bottom of the contact hole depending on the process. If the first buried wiring is narrower in width than the second buried wiring or if the first buried wiring and the second buried wiring are mutually equal to each other in width, the Cu voiding can likewise occur. Accordingly, the invention may be applicable to the case where the widths of the first buried wiring and the second buried wiring are kept relatively in any kind of relation with each other.

As having described hereinbefore, according to the invention, where Cu is used as a low resistance wiring, the voiding of Cu caused by stress migration can be reliably prevented, and the electric connection between the first buried wiring and the second buried wiring can be kept over a long time. As a result, a semiconductor device having high reliability can be provided.

While preferred embodiments of the invention have been described using specific terms, such description is for illustrative purposes only, and it is to be understood that changes and variations may be made without departing from the spirit or scope of the following claims.

What is claimed is:

1. A semiconductor device comprising:
   a first buried wiring;
   a second buried wiring formed as a layer different from said first buried wiring;
   a contact hole formed between said first buried wiring and said second buried wiring and filled with a wiring material electrically connecting said first buried wiring and said second buried wiring therethrough; and
   a dummy hole formed to have a hole diameter substantially different from that of said contact hole and in the vicinity of said contact hole so that a surface of said first buried wiring is exposed to said dummy hole, wherein said dummy hole is adapted to cause a void to form in association with said dummy hole when said dummy hole is at least partially filled with said wiring material.

2. The semiconductor device according to claim 1, wherein said second buried wiring is formed under said first buried wiring, and said dummy hole is formed below said first buried wiring and said diameter of said dummy hole is substantially smaller than said contact hole.

3. The semiconductor device according to claim 2, wherein said diameter of said dummy hole is so set as to cause a plugging failure to form said void when said dummy hole is at least partially filled with said wiring material.

4. The semiconductor device according to claim 1, wherein said second buried wiring is formed over said first buried wiring, and said dummy hole is formed over said first buried wiring and said diameter of said dummy hole is substantially smaller than said contact hole.

5. The semiconductor device according to claim 4, wherein said diameter of said dummy hole is so set as to cause a plugging failure to form said void when said dummy hole is at least partially filled with said wiring material.

6. The semiconductor device according to claim 1, wherein said wiring material is made of copper.

* * * * *